(12) United States Patent
Windisch et al.

(10) Patent No.: US 8,283,684 B2
(45) Date of Patent: Oct. 9, 2012

(54) LED SEMICONDUCTOR BODY AND USE OF AN LED SEMICONDUCTOR BODY

(75) Inventors: Reiner Windisch, Pettendorf (DE); Ralph Wirth, Mintraching-Auhof (DE); Stefan Groetsch, Lengfeld-Bad Abbach (DE); Georg Bogner, Lappersdorf (DE); Guenter Kirchberger, Sinzing (DE); Klaus Streubel, Laaber (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 525 days.

(21) Appl. No.: 12/443,155

(22) PCT Filed: Sep. 19, 2007

(86) PCT No.: PCT/DE2007/001693
§ 371 (c)(1),
(2), (4) Date: Mar. 26, 2009

(87) PCT Pub. No.: WO2008/040300
PCT Pub. Date: Apr. 10, 2008

(65) Prior Publication Data
US 2011/0240955 A1   Oct. 6, 2011

(30) Foreign Application Priority Data
Sep. 28, 2006   (DE) .................. 10 2006 046 038

(51) Int. Cl.
*H01L 33/00* (2010.01)
(52) U.S. Cl. ........ 257/96; 257/13; 257/89; 257/E25.032

(58) Field of Classification Search .................. None
See application file for complete search history.

(56) References Cited

U.S. PATENT DOCUMENTS

| | | | |
|---|---|---|---|
| 4,939,426 A | | 7/1990 | Menard et al. |
| 5,608,237 A | * | 3/1997 | Aizawa et al. ............... 257/132 |
| 6,323,598 B1 | | 11/2001 | Guthrie et al. |
| 2001/0032985 A1 | * | 10/2001 | Bhat et al. ..................... 257/88 |
| 2002/0139987 A1 | | 10/2002 | Collins, III et al. |
| 2004/0066816 A1 | * | 4/2004 | Collins et al. ................. 372/44 |
| 2004/0129944 A1 | | 7/2004 | Chen |
| 2005/0001223 A1 | * | 1/2005 | Linder et al. ................... 257/98 |
| 2005/0001225 A1 | | 1/2005 | Yoshimura et al. |
| 2005/0067627 A1 | | 3/2005 | Shen et al. |
| 2006/0097269 A1 | | 5/2006 | Lester |
| 2007/0158659 A1 | * | 7/2007 | Bensce ......................... 257/79 |
| 2007/0278502 A1 | | 12/2007 | Shakuda et al. |
| 2009/0065800 A1 | | 3/2009 | Wirth et al. |

FOREIGN PATENT DOCUMENTS

| | | |
|---|---|---|
| DE | 2 323 971 | 11/1974 |
| DE | 23 42 298 | 2/1975 |
| DE | 219 086 A3 | 2/1985 |

(Continued)

*Primary Examiner* — Thomas L Dickey
*Assistant Examiner* — Scott R Wilson
(74) *Attorney, Agent, or Firm* — Slater & Matsil, L.L.P.

(57) ABSTRACT

An LED semiconductor body includes a number of at least two radiation-generating active layers. Each active layer has a forward voltage, wherein the number of active layers is adapted to an operating voltage in such a way that the voltage dropped across a series resistor connected in series with the active layers is at most of the same magnitude as a voltage dropped across the LED semiconductor body. The invention furthermore describes various uses of the LED semiconductor body.

27 Claims, 3 Drawing Sheets

FOREIGN PATENT DOCUMENTS

| | | |
|---|---|---|
| DE | 219086 A3 * | 2/1985 |
| DE | 39 29 477 A1 | 3/1991 |
| DE | 9404982.3 U1 * | 7/1992 |
| DE | 94 04 982.3 U1 | 6/1994 |
| DE | 10 2004 004 765 A1 | 9/2005 |
| EP | 0 493 015 A2 | 7/1992 |
| EP | 1 403 935 A2 | 3/2004 |
| GB | 1 457 777 | 12/1976 |
| GB | 1 485 462 | 9/1977 |
| JP | 2000-244020 A | 9/2000 |
| JP | 2004-186278 A | 7/2004 |
| JP | 2005-229037 A | 8/2005 |
| JP | 2006-080442 A | 3/2006 |
| JP | 2007-523483 A | 8/2007 |
| WO | WO 2006/083065 A1 | 8/2006 |

* cited by examiner

LED SEMICONDUCTOR BODY AND USE OF AN LED SEMICONDUCTOR BODY

This patent application claims the priority of German patent application 10 2006 046 038.3 filed Sep. 28, 2006, the disclosure content of which is hereby incorporated by reference.

TECHNICAL FIELD

The invention relates to an LED semiconductor body and to uses of an LED semiconductor body of this type.

A light emitting diode typically has a forward voltage of 1.5 V to 3.2 V. Since customary operating voltages are generally higher (for example automobile battery: 12 V, mains voltage depending on country: 230 V or 110 V), the light emitting diode cannot be connected directly to the voltage sources. Therefore, the light emitting diode is connected in series with a series resistor, for example, wherein a considerable part of the operating voltage is generally dropped across the series resistor. This leads to a low efficiency since that part of the operating voltage which is dropped across the series resistor is not utilized for generating radiation. As an alternative, it is possible to use a DC-DC converter that chops the operating voltage into an AC voltage, wherein the operating voltage is stepped down to the necessary voltage and is subsequently rectified. This procedure requires a significant additional outlay.

SUMMARY

In a first aspect, the present invention specifies an LED semiconductor body which can be operated in an efficient and simple manner by means of a predetermined operating voltage.

In another aspect, the present invention specifies uses of such an LED semiconductor body.

An LED semiconductor body according to the invention comprises a number of at least two radiation-generating active layers each having a forward voltage, wherein the number of layers is adapted to an operating voltage in such a way that the voltage dropped across a series resistor connected in series with the active layers is at most the same magnitude as a voltage dropped across the LED semiconductor body.

It is advantageously possible to obtain a higher efficiency by means of the LED semiconductor body according to the invention than by means of a conventional light emitting diode since a comparatively small part of the voltage is dropped across the series resistor as a result of the adaptation of the number of layers to the operating voltage. Furthermore, the LED semiconductor body according to the invention does not require complicated driving, but rather can be operated by means of a simple series circuit comprising a resistor and an LED semiconductor body.

In the present case, the active layer can comprise for example a pn junction, a double heterostructure, a single quantum well or a multiple quantum well (MQW) structure.

In accordance with one preferred embodiment, the voltage dropped across the series resistor is less than the smallest forward voltage dropped in the LED semiconductor body. In other words, the LED semiconductor body is extended by an additional active layer until the voltage dropped across the LED semiconductor body would be greater than the operating voltage as a result of the addition of a further active layer with the smallest forward voltage. In this embodiment, the available electrical energy is converted into radiation energy in an optimum manner since the voltage dropped across the series resistor becomes minimal.

In accordance with an embodiment to which further preference is given, the active layers are monolithically integrated in the semiconductor body. This obviates the production step of connecting a first layer stack comprising the first active layer to a second layer stack comprising the second active layer, for example by means of bonding.

In one advantageous development of the LED semiconductor body, a tunnel junction is formed between the first active layer and the second active layer. This tunnel junction serves as an electrical connection between the first and second active layers. By way of example, such a tunnel junction can be formed by means of a highly doped layer of a first conductivity type and a highly doped layer of a second conductivity type.

In this development, the first and the second active layers are preferably arranged in the same sense, such that their pn junctions therefore form a pn-pn or np-np structure, wherein the pn junctions are electrically connected in series by means of the intervening tunnel junction. In the context of the present invention, it is also possible, in a similar manner, for three or more active layers to be arranged vertically one above another in the LED semiconductor body, which are connected in a corresponding manner by a respective tunnel junction formed between two adjacent active layers.

It is also conceivable for the semiconductor body to be composed of separately fabricated layer stacks. In this case, the semiconductor body is preferably formed without a tunnel junction. Furthermore, the separately fabricated layer stacks can be thin-film semiconductor bodies.

Particularly preferably, the active layers are arranged one above another in a vertical direction. In the present case, the vertical direction denotes a direction running perpendicular to a main extension direction of the active layers.

In a first variant of the LED semiconductor body, the first and the second active layer emit radiation having the same wavelength. It is advantageous that the quantity of radiation and, in particular, the radiation density for a predetermined wavelength are thus advantageously increased by comparison with conventional LED semiconductor bodies.

In a second variant of the LED semiconductor body, the first and the second active layers generate radiation having different wavelengths. This variant has the advantage that the emission spectrum of the LED semiconductor body overall is widened. This is advantageous in particular for generating mixed-colored light, preferably white light.

In accordance with one preferred configuration, the LED semiconductor body is integrated with the series resistor into a chip. In contrast to a conventional light emitting diode, in which a considerable part of the operating voltage is dropped across the series resistor, as a result of which the latter heats up to a great extent, according to the invention the evolution of heat at the series resistor is relatively low. Therefore, the series resistor can be integrated with the LED semiconductor body into a chip without having to fear impairments of the semiconductor body by the evolution of heat caused.

In accordance with a further configuration, the LED semiconductor body is integrated with the series resistor into a housing body. It holds true for this configuration, too, that there is advantageously no need to fear any impairments of the semiconductor body by evolution of heat at the series resistor.

The two configurations with an integrated series resistor permit a compact component for which just the specification of the required operating voltage suffices for putting it into operation and in which control of the operating current is obviated.

In accordance with a first variant, the LED semiconductor body is preferably operated by means of a DC voltage. This enables radiation to be generated continuously by means of the LED semiconductor body.

Preferred operating voltages are 5 V, 12 V or 24 V. These are operating voltages which can be supplied by customary voltage sources such as, for example, standard power supply units or batteries, in particular automobile batteries.

The LED semiconductor body expediently comprises a first and a second outer contact for an electrical connection. By means of the electrical contacts, which are preferably applied on a surface of the LED semiconductor body, the LED semiconductor body can be electrically conductively connected to a voltage source. In particular, a first operating voltage can be applied to the LED semiconductor body by means of the first and the second outer contact.

In addition to the two outer contacts, the LED semiconductor body can comprise an inner contact arranged between two active layers. In particular, a second operating voltage can be applied to the LED semiconductor body by means of the first or second outer contact and the inner contact. In the case where the two active layers are connected in series and arranged in the same sense, the second operating voltage is usually lower than the first operating voltage. The advantage of an arrangement comprising at least one inner contact is that the LED semiconductor body can be operated by means of different operating voltages. A "voltage cascade" LED semiconductor body can thereby be realized. In principle, the LED semiconductor body can have a plurality of inner contacts.

In accordance with one preferred variant, the LED semiconductor body comprises three inner contacts. By way of example, an operating voltage of 5 V can be applied to the LED semiconductor body by means of the first outer contact and the first inner contact. Furthermore, an operating voltage of 9 V can be applied to the LED semiconductor body by means of the first outer contact and the second inner contact. Furthermore, an operating voltage of 12 V can be applied to the LED semiconductor body by means of the first outer contact and the third inner contact. Finally, it is possible to apply an operating voltage of 24 V to the LED semiconductor body by means of the first outer contact and the second outer contact. It should be noted that, preferably, the first inner contact is disposed downstream of the first outer contact in a vertical direction, while the second inner contact is disposed downstream of the first inner contact and the third inner contact is disposed downstream of the second inner contact in a vertical direction. Particularly preferably, the second outer contact is in turn disposed downstream of the third inner contact in a vertical direction. Furthermore, it should be pointed out that the invention is of course not fixed at the voltage values specified. Rather, the inner contacts can be arranged between the active layers in such a way that the LED semiconductor body can be operated by means of customary available voltage sources.

In accordance with a first variant, the active layers are connected in series. In this case, the active layers are preferably arranged in the same sense, that is to say that their pn junctions form a pn- . . . -pn or np- . . . -np structure.

In accordance with a second variant, two active layers of the LED semiconductor body are connected in antiparallel. In this case, too, the active layers can be arranged in the same sense, such that their pn junctions form a pn-pn or np-np structure.

The operating voltage by means of which the LED semiconductor body can be operated in accordance with the second variant is preferably an AC voltage. In this case, one of the two layers is alternately radiation-active. This advantageously facilitates the operation of the LED semiconductor body according to the invention by means of a conventional domestic AC voltage since, in contrast to a conventional LED semiconductor body, a rectifier is not necessary for operation. By way of example, the LED semiconductor body can be used as a replacement for an incandescent lamp. AC voltages that are appropriate as operating voltages according to the invention can be for example 2 V, 12 V or 18 V.

In accordance with one embodiment, the semiconductor body, preferably at least one of the active layers, can contain $Al_nGa_mIn_{1-n-m}P$, where $0 \leq n \leq 1$, $0 \leq m \leq 1$ and $n+m \leq 1$.

In accordance with a further embodiment, the semiconductor body, preferably at least one of the active layers, can contain $Al_nGa_mIn_{1-n-m}As$, where $0 \leq n \leq 1$, $0 \leq m \leq 1$ and $n+m \leq 1$.

In accordance with a further embodiment, the semiconductor body, preferably at least one of the active layers, can contain $Al_nGa_mIn_{1-n-m}$, where $0 \leq n \leq 1$, $0 \leq m \leq 1$ and $n+m \leq 1$.

The LED semiconductor body is preferably a thin-film semiconductor body. If the LED semiconductor body comprises a plurality of layer stacks, then the latter are produced by means of thin-film technology, in particular.

A thin-film semiconductor body is distinguished in particular by at least one of the following characteristic features:
- a reflective layer is applied or formed at a first main area—facing toward a carrier element—of a radiation-generating epitaxial layer sequence, said reflective layer reflecting at least part of the electromagnetic radiation generated in the epitaxial layer sequence back into the latter;
- the epitaxial layer sequence has a thickness in the region of 20 µm or less, in particular in the region of 10 µm; and
- the epitaxial layer sequence contains at least one semiconductor layer having at least one area having an intermixing structure which ideally leads to an approximately ergodic distribution of the light in the epitaxial layer sequence, that is to say that it has an as far as possible ergodically stochastic scattering behavior.

A basic principle of a thin-film light emitting diode chip is described for example in I. Schnitzer et al., Appl. Phys. Lett. 63 (16), Oct. 18, 1993, 2174-2176, the disclosure content of which in this respect is hereby incorporated by reference.

A thin-film semiconductor body is, to a good approximation, a Lambertian surface emitter and is therefore particularly well suited for application in a headlight.

In lighting systems such as, for example, general lighting systems or vehicle lighting systems, the available voltage sources generally have a predetermined invariable operating voltage. The LED semiconductor body according to the invention can advantageously be adapted to these operating voltages by means of the number of active layers.

Furthermore, the LED semiconductor body can advantageously be used for backlighting, for example of displays, or for projection applications.

The LED semiconductor body according to the invention can expediently serve as a radiation source in a radiation-emitting component, wherein the radiation-emitting component is also suitable for the uses mentioned.

BRIEF DESCRIPTION OF THE DRAWINGS

Further features, advantages and developments of the invention will become apparent from the exemplary embodiments explained below in conjunction with FIGS. 1 to 5.

In the Figures.

DETAILED DESCRIPTION

Figure 1:
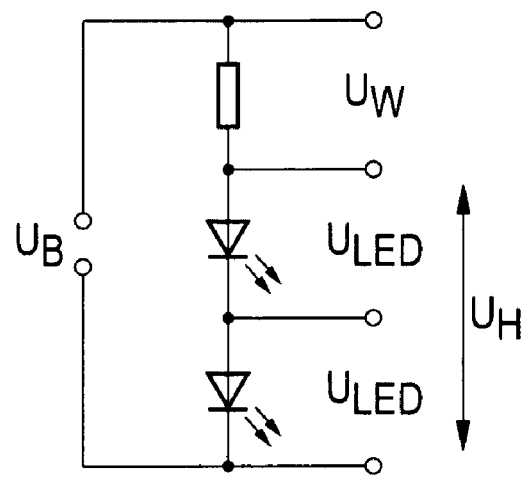
FIG. 1 shows a block diagram of an arrangement comprising a series resistor and a first exemplary embodiment of an LED semiconductor body according to the invention.

The arrangement on which the block diagram illustrated in FIG. 1 is based comprises a voltage source, a series resistor and an LED semiconductor body including two active layers. The voltage source supplies an operating voltage $U_B$, which is preferably a DC voltage. An LED semiconductor body whose active layers have a forward voltage $U_{LED}$ is connected to the voltage source. During operation, in the two active layers arranged in the forward direction, radiation is generated, which is indicated by arrows.

The number of active layers is adapted to the operating voltage $U_B$ in such a way that a voltage $U_W$ dropped across the series resistor is at most of the same magnitude as a voltage $U_H$ dropped across the LED semiconductor body.

By way of example, an operating voltage $U_B$=12 V is available in the case of an automobile battery. The forward voltage $U_{LED}$ of the two active layers can be 3 V, for example. Since the active layers are connected in series, the voltage $U_H$ dropped across the LED semiconductor body amounts to 6 V. Consequently, the voltage dropped across the series resistor is $U_W$=6 V and is therefore equal in magnitude to the sum of the individual forward voltages $U_{LED}$. In comparison with a conventional LED semiconductor body having only one active layer, 25% more electrical energy can be utilized for generating radiation by means of the LED semiconductor body according to the invention. The LED semiconductor body according to the invention thus advantageously has a higher efficiency than the conventional LED semiconductor body.

Figure 2:
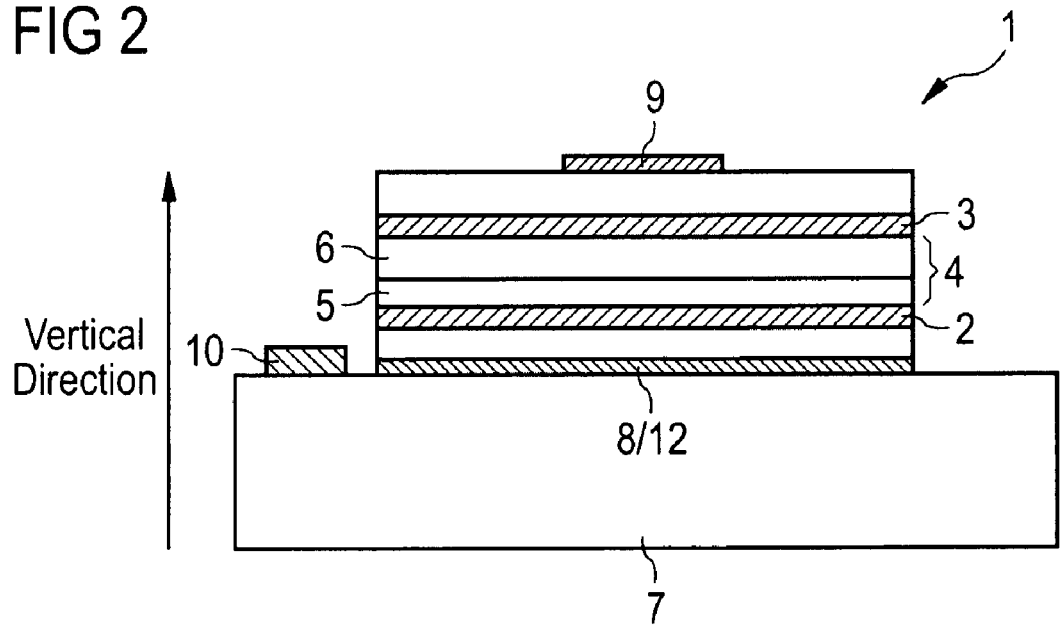
FIG. 2 shows a schematic cross-sectional view of the first exemplary embodiment of an LED semiconductor body according to the invention.

The LED semiconductor body on which the block diagram is based can be embodied in the manner illustrated in FIG. 2.

The LED semiconductor body 1 in accordance with FIG. 2 comprises a first radiation-generating active layer 2 and a second radiation-generating active layer 3, wherein the active layers 2, 3 are arranged one above the other in a vertical direction, that is to say perpendicular to a main extension direction of the active layers. A tunnel junction 4 is formed between the active layers 2, 3, said tunnel junction being formed by means of a first semiconductor layer 5 of a first conductivity type, for example an n-conducting semiconductor layer, and a second semiconductor layer 6 of a second conductivity type, for example a p-conducting semiconductor layer. Preferably, these two semiconductor layers 5, 6 are embodied in highly doped fashion, such that an efficient tunnel junction having a low electrical contact resistance arises during operation. The active layers 2, 3 are arranged in the same sense, that is to say that their pn junctions form a pn-pn or np-np structure. The active layers 2, 3 are connected in series by means of the tunnel junction 4.

By virtue of the arrangement of the two active layers 2, 3 in the LED semiconductor body 1, the total forward voltage $U_{LED}$ is increased by comparison with a conventional LED semiconductor body having only one active layer. Furthermore, the voltage $U_W$ dropped across the series resistor 10 is lower, whereby the electrical energy available for generating radiation is advantageously increased. Since the dimensions of the LED semiconductor body 1 change only insignificantly by comparison with the conventional LED semiconductor body and, in particular, the cross section of the LED semiconductor body 1 is independent of the number of active layers, the radiation density is also advantageously increased in addition to the quantity of radiation.

The semiconductor body 1 is arranged on a carrier element 7. A surface of the semiconductor body 1 which faces the carrier element 7 is preferably provided with a reflection layer 8 for reflecting the radiation generated by the active layers 2, 3 in a vertical direction. Particularly preferably, the reflection layer 8 simultaneously forms a first outer contact 12 for the LED semiconductor body 1. A second outer contact 9, in particular, can be formed on a side of the LED semiconductor body 1 opposite to the carrier element 7. A vertically conductive component is thus formed which is distinguished by a comparatively homogeneous current distribution within the LED semiconductor body 1.

The series resistor 10 is preferably arranged on the carrier element 7. This arrangement is technically expedient because, according to the invention, the voltage $U_W$ dropped across the series resistor 10 is comparatively low and the heat loss that arises in this case is therefore also comparatively low. The risk of thermally induced disturbances or damage is thereby reduced. The joint arrangement of the LED semiconductor body 1 and of the series resistor 10 on the carrier element 7 advantageously enables a comparatively high integration density.

The LED semiconductor body 1 is grown in particular on a separate growth substrate and subsequently mounted onto the carrier element 7, for example by means of soldering, bonding or adhesive bonding, the growth substrate preferably being stripped away from the LED semiconductor body 1. Preferably, the LED semiconductor body 1 is a thin-film semiconductor body. Particularly preferably, the active layers 2, 3 emit radiation having the same wavelength, wherein the vertical direction specifies the main emission direction.

Figure 3:
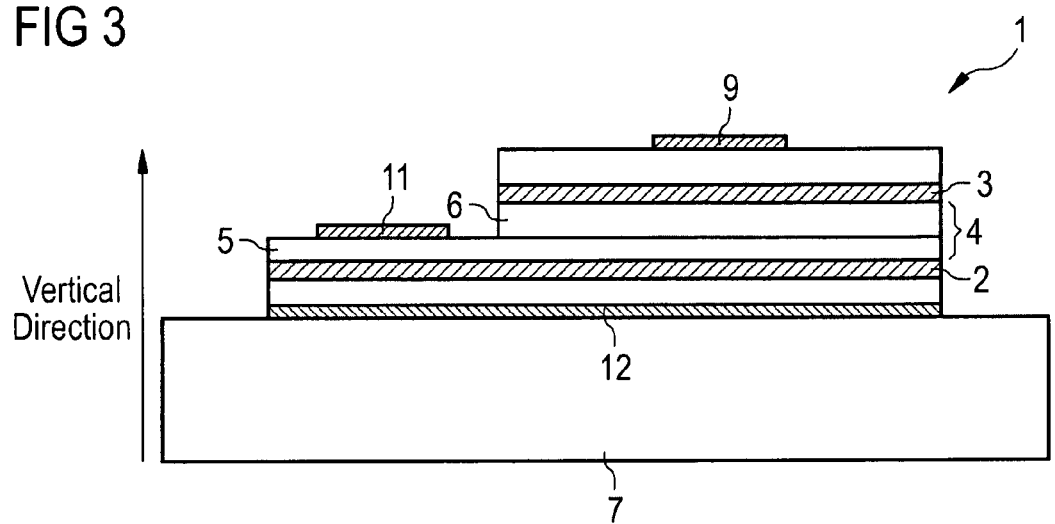
FIG. 3 shows a schematic cross-sectional view of a second exemplary embodiment of an LED semiconductor body according to the invention.

The LED semiconductor body 1 illustrated in FIG. 3 comprises, for an electrical connection, the first outer contact 12, which is arranged on the rear side, for example, and the second outer contact 9, which is arranged on the front side, for example. A first operating voltage $U_B$ can be applied to the LED semiconductor body 1 by means of the first and the second outer contacts 12, 9.

In addition to the two outer contacts 9, 12, the LED semiconductor body 1 has an inner contact 11 arranged between the first active layer 2 and the second active layer 3. A second operating voltage $U_B$ can be applied to the LED semiconductor body 1 by means of the first or second outer contact 12, 9 and the inner contact 11.

In the case where the two active layers 2, 3 are connected in series and arranged in the same sense, the second operating voltage is lower than the first operating voltage. The LED semiconductor body 1 can therefore be operated by means of different operating voltages.

According to the invention, a plurality of active layers can be arranged between the first outer contact 12 and the inner contact 11 and also between the second outer contact 12 and the inner contact 11. By way of example, in each case two active layers having a forward voltage $U_{LED}$=2 V can be arranged therebetween. The operating voltage $U_B=5$ V can then be applied between the first outer contact 12 and the inner contact 11, while the operating voltage $U_B=9$ V can be applied between the first outer contact 12 and the second outer contact 9. The voltage dropped across the series resistor is advantageously low and amounts to $U_W=1$ V.

Figure 4:
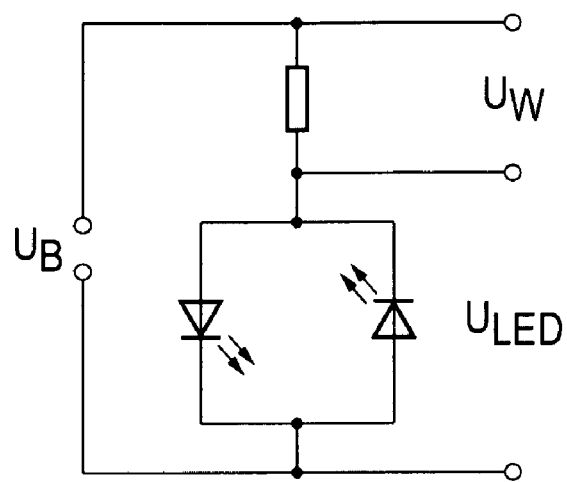
FIG. 4 shows a block diagram of an arrangement comprising a series resistor and a third exemplary embodiment of an LED semiconductor body according to the invention.

The arrangement on which the block diagram illustrated in FIG. 4 is based comprises a voltage source, a series resistor and an LED semiconductor body including two active layers. The voltage source supplies an operating voltage $U_B$, which is preferably an AC voltage. An LED semiconductor body whose active layers have a forward voltage $U_{LED}$ is connected to the voltage source. Since the two active layers are connected in antiparallel, they generate radiation alternately in the case of an AC voltage.

The number of active layers is adapted to the operating voltage $U_B$ in such a way that the voltage $U_W$ dropped across the series resistor is at most equal in magnitude to the voltage $U_H$ dropped across the LED semiconductor body. In particular, the voltage $U_H$ dropped across the LED semiconductor body in the case of this arrangement corresponds to the respective forward-biased forward voltage $U_{LED}$.

An LED semiconductor body with layers connected in antiparallel as used in the arrangement in accordance with FIG. 4 advantageously facilitates the operation of the LED semiconductor body according to the invention by means of a conventional domestic AC voltage since, in contrast to a conventional LED semiconductor body, a rectifier is not necessary for operation. By way of example, the LED semiconductor body can be used as a replacement for an incandescent lamp.

Figure 5:
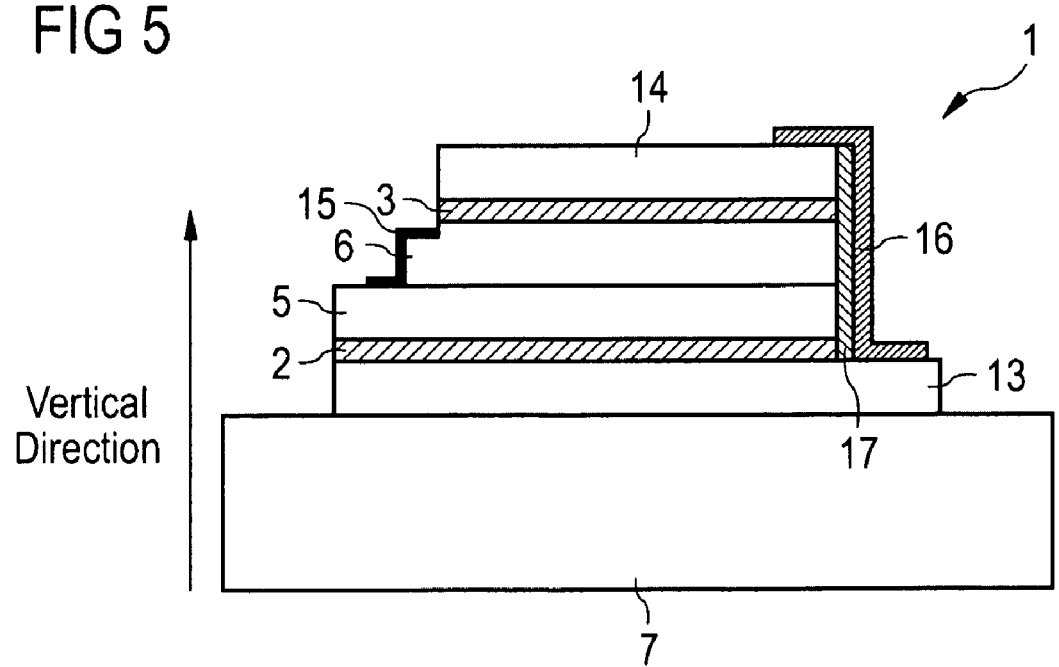
FIG. 5 shows a schematic cross-sectional view of the third exemplary embodiment of an LED semiconductor body according to the invention.

The LED semiconductor body on which the block diagram is based can be embodied in the manner illustrated in FIG. 5.

The LED semiconductor body 1 in accordance with FIG. 5 comprises a first radiation-generating active layer 2 and a second radiation-generating active layer 3, wherein the active layers 2, 3 are arranged one above the other in a vertical direction, that is to say perpendicular to a main extension direction of the active layers. A first semiconductor layer 5 of a first conductivity type, for example an n-conducting semiconductor layer, and a second semiconductor layer 6 of a second conductivity type, for example a p-conducting semiconductor layer, are arranged between the active layers 2, 3. The LED semiconductor body 1 is delimited by a first outer semiconductor layer 13 of the second conductivity type on the rear side and by a second outer semiconductor layer 14 of the first conductivity type on the front side. The active layers 2, 3 are arranged in the same sense, that is to say that their pn junctions form a pn-pn or np-np structure.

The first semiconductor layer 5 is electrically conductively connected to the second semiconductor layer 6 by means of a first connecting layer 15. The first connecting layer 15 is preferably connected to a first electrical contact. Furthermore, the first outer semiconductor layer 13 is electrically conductively connected to the second outer semiconductor layer 14 by means of a second connecting layer 16. The second connecting layer 16 is preferably connected to a second electrical contact. In order to avoid a short circuit, the second connecting layer 16 is arranged on an electrical insulation layer 17.

The semiconductor body 1 is arranged on a carrier element 7.

It should be noted that the LED semiconductor body according to the invention is not restricted to the embodiment in which the active layers are monolithically integrated. Rather, the LED semiconductor body 1 according to the invention can also be formed from individual layer stacks which are connected to one another and which each have at least one active layer.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. A light emitting device comprising:
    an LED semiconductor body comprising a number of radiation-generating active layers, the number being at least two; and
    a resistor connected in series with the active layers;
    wherein, the number of active layers is adapted to an operating voltage applied to the light emitting device in such a way that a voltage drop across the resistor is at most of the same magnitude as a voltage drop across the LED semiconductor body; and
    wherein the LED semiconductor body is integrated with the series resistor into a chip.

2. The light emitting device as claimed in claim 1, wherein the active layers each have a forward voltage and wherein the voltage drop across the resistor is less than the smallest forward voltage drop in the LED semiconductor body.

3. The light emitting device as claimed in claim 1, wherein the active layers are monolithically integrated in the LED semiconductor body.

4. The light emitting device as claimed in claim 1, wherein the active layers are arranged one above another in a vertical direction.

5. The light emitting device as claimed in claim 1, wherein the active layers generate radiation having the same wavelength.

6. The light emitting device as claimed in claim 1, wherein the active layers generate radiation having different wavelengths.

7. The light emitting device as claimed in claim 1, further comprising a housing body, wherein the LED semiconductor body is integrated with the series resistor into the housing body.

8. The light emitting device as claimed in claim 1, further comprising a tunnel junction formed between two of the active layers.

9. The light emitting device as claimed in claim 1, wherein the LED semiconductor body comprises a first and a second outer contact for an electrical connection.

10. The light emitting device as claimed in claim 9, wherein a first operating voltage can be applied to the light emitting device by means of the first and the second outer contacts.

11. The light emitting device as claimed in claim 10, further comprising an inner contact between two of the active layers.

12. The light emitting device as claimed in claim 11, wherein a second operating voltage can be applied to the light emitting device by means of the first or second outer contact and the inner contact.

13. The light emitting device as claimed in claim 1, wherein the operating voltage is a DC voltage.

14. The light emitting device as claimed in claim 13, wherein the LED semiconductor body comprises three inner contacts.

15. The light emitting device as claimed in claim 14, wherein an operating voltage of 5 V can be applied to the light emitting device to cause the light emitting device to emit light, the operating voltage applied by means of the first outer contact and a first inner contact.

16. The light emitting device as claimed in claim 15, wherein an operating voltage of 9 V can be applied to the light emitting device to cause the light emitting device to emit light, the operating voltage applied by means of the first outer contact and a second inner contact.

17. The light emitting device as claimed in claim 16, wherein an operating voltage of 12 V can be applied to the light emitting device to cause the light emitting device to emit light, the operating voltage applied by means of the first outer contact and a third inner contact.

18. The light emitting device as claimed in claim 17, wherein an operating voltage of 24 V can be applied to the light emitting device to cause the light emitting device to emit light, the operating voltage applied by means of the first outer contact and the second outer contact.

19. The light emitting device as claimed in claim 1, wherein the operating voltage is 5 V, 12 V or 24 V.

20. The light emitting device as claimed in claim 1, wherein the operating voltage is an AC voltage.

21. The light emitting device as claimed in claim 20, wherein the operating voltage is 2 V, 12 V or 18 V.

22. The light emitting device as claimed in claim 1, wherein two of the active layers are connected in antiparallel.

23. The light emitting device as claimed in claim 1, wherein the active layers are connected in series.

24. The light emitting device as claimed in claim 1, wherein at least one of the active layers comprises $Al_nGa_mIn_{1-n-m}P$, where $0 \leq n \leq 1$, $0 \leq m \leq 1$ and $n+m \leq 1$.

25. The light emitting device as claimed in claim 1, wherein at least one of the active layers comprises $Al_nGa_mIn_{1-n-m}As$, where $0 \leq n \leq 1$, $0 \leq m \leq 1$ and $n+m \leq 1$.

26. The light emitting device as claimed in claim 1, wherein at least one of the active layers comprises $Al_nGa_mIn_{1-n-m}N$, where $0 \leq n \leq 1$, $0 \leq m \leq 1$ and $n+m \leq 1$.

27. The light emitting device as claimed in claim 1, wherein the LED semiconductor body is a thin-film semiconductor body.

* * * * *